United States Patent
Casteel et al.

(10) Patent No.: US 7,433,213 B2
(45) Date of Patent: Oct. 7, 2008

(54) THYRISTOR POWER CONVERTER FILTER FOR EXCITATION APPLICATIONS

(75) Inventors: Jordan B. Casteel, Roanoke, VA (US); John E. Bittner, Troutville, VA (US)

(73) Assignee: General Electric Company, Schenectady, NY (US)

( * ) Notice: Subject to any disclaimer, the term of this patent is extended or adjusted under 35 U.S.C. 154(b) by 258 days.

(21) Appl. No.: 11/528,207

(22) Filed: Sep. 27, 2006

(65) Prior Publication Data

US 2008/0074910 A1 Mar. 27, 2008

(51) Int. Cl.
*H02M 1/12* (2006.01)
(52) U.S. Cl. .............................. 363/44; 363/40; 323/222
(58) Field of Classification Search .................. 363/17, 363/20, 39, 40, 41, 44, 125, 141–144; 323/222, 323/20, 360, 224; 307/33, 154
See application file for complete search history.

(56) References Cited

U.S. PATENT DOCUMENTS

| | | | | |
|---|---|---|---|---|
| 4,683,529 A | * | 7/1987 | Bucher, II | 363/44 |
| 4,888,675 A | * | 12/1989 | Kumar et al. | 363/47 |
| 5,907,467 A | * | 5/1999 | Barbour | 361/170 |
| 6,442,051 B1 | | 8/2002 | Ryan et al. | |
| 6,734,655 B1 | * | 5/2004 | Javanifard et al. | 323/222 |
| 6,879,500 B2 | * | 4/2005 | Liu et al. | 363/40 |

* cited by examiner

*Primary Examiner*—Rajnikant B Patel
(74) *Attorney, Agent, or Firm*—Edward J. Smith; Ernest G. Cusick; Frank A. Landgraff

(57) ABSTRACT

An exciter system for the field of a synchronous generator excitation is provided. The exciter system includes an AC power source; a three-phase thyristor bridge having six legs, the three-phase bridge being connectable with the AC power source, and being adapted to provide a variable DC voltage output; a thyristor in each of the six legs of the three-phase bridge, wherein the thyristors provide a path for a device current; and a three-phase AC line filter series, including series resistive and capacitive elements across each phase of the AC power source and a plurality of bleed resistors, wherein at least one bleed resistor is connected to each AC input connection of the filter.

16 Claims, 5 Drawing Sheets

THYRISTOR POWER CONVERTER FILTER FOR EXCITATION APPLICATIONS

BACKGROUND OF THE INVENTION

The invention relates generally to an apparatus and method for converting AC voltage to a variable DC voltage and more specifically to an apparatus for converting AC voltage to a variable DC voltage for exciting the field windings of electrical generating equipment.

It has been common practice to use a full thyristor bridge to convert AC voltage to a variable DC voltage for exciting the rotating field of a synchronous generator. A typical example of an exciter 10, employing such a full thyristor bridge, is shown in FIG. 1. The full thyristor bridge 100 includes six thyristors 101-106, one connected in each of six legs of the bridge. A full thyristor bridge circuit includes many advantages such as the ability to transiently invert field voltage to rapidly decrease generator field flux linkages.

Conventional phase-controlled thyristor power converters ("bridges") have been used in DC motor drive and generator excitation supplies for several decades. The thyristors ("SCRs") used in these bridges have electrical specifications such as peak voltage and maximum rate of change of voltage (dv/dt) and maximum rate of change of current (di/dt), which must not be exceeded in order to ensure reliable operation. With respect to maximum di/dt, a thyristor requires time to distribute current conduction uniformly throughout the junctions. If the rate of rise of anode current is very fast, localized heating will occur due to high current density, resulting in excessive temperature and possible failure of the device. Exceeding maximum dv/dt across a thyristor may cause the device to turn on without a gating signal at an unintended time.

Various components are added to the bridges to meet these specifications. An RC snubber is often placed in parallel with each thyristor to control the dv/dt and voltage overshoot. An inductor ("ferrite") may be placed in series with each thyristor to control the di/dt. In addition to the RC filter across the SCR, sometimes a three-phase delta RC filter ("AC line filter") is connected across the incoming power source. This filter has the benefit of reducing the size of the RC snubber across the SCR. Further, balancing or peak repetitive voltage (PRV) resistors may be placed from each AC input line to each of the positive and negative DC output lines. The PRV resistors balance voltage across thyristor cells from the positive DC bus to the negative DC bus during the off state. The PRV resistors also permit a higher pole slip voltage without exceeding peak cell voltage. An RC filter may also be placed across the thyristor bridge DC output to limit peak voltage and dv/dt to the load. In excitation systems this is often referred to as a shaft voltage suppressor (SVS).

Referring again to FIG. 1, each of the six thyristors incorporates a snubber circuit 110, including snubber capacitor 115 and snubber resistor 120 in parallel with each thyristor 101-106. Leg ferrites 125 may be provided in each leg of the three-phase bridge 100. Line ferrites 130 may be provided on the input line to each phase of the three-phase bridge 100.

FIG. 1 also illustrates a three-phase AC line filter 170. Each leg of the three-phase AC line filter 170 includes a parallel combination of a series filter resistor 180 and series filter capacitor 185 with a discharge resistor 190. The three-phase AC line filter 170 is typically designed to absorb transients from the AC line power source 140 and from the bridge 100.

An output shaft voltage suppressor 195 providing voltage transient absorbing circuits 197 with RC elements 199 is further shown in FIG. 1. The DC output of the three-phase thyristor bridge in input is input to field windings 193 of the electrical generating equipment (not shown) being supplied.

All of these filtering components together typically exceed the cost of the thyristors themselves. Excitation bridges may be supplied with all of these components, for a number of reasons. Early thyristors were fragile and needed good protection, so significant conservatism was incorporated in the design. Bridges designed for more stringent applications such as common transformer motor drives have been directly used for exciters. Further designs may be set conservatively due to the high reliability and availability requirements of the electric power generation industry. Excitation bridges by GE® have typically incorporated all the above described protective features. Incorporation of all the above protective features provides reliable operation and highly protected components, but results in increased material and labor costs.

During the transition of an SCR 101-106 from conducting to blocking, there is a charge in the SCR 101-106 which much be removed before the SCR 101-106 can block reverse current. This energy typically goes into the snubber capacitors 120, the AC line filter capacitors 185, or a bucket suppressor capacitor 280 (FIG. 2). If this charge is not absorbed by a component such as these, high voltage and dv/dt transients occur in the exciter or associated external equipment such as the generator field or the source transformer.

Bucket filters have been used on certain exciters in place of snubbers, ferrites and the three-phase AC line filter. In these applications, the bucket filter is employed in an attempt to absorb the energy that otherwise would have been absorbed by the snubbers across each thyristor.

A typical bucket filter is illustrated in FIG. 2. The bucket filter 200 includes a three-phase diode bridge 205 having six legs across an AC source 140. Each bridge leg 215 includes two series diodes 220 (or may be a single diode) in parallel with two series resistors 230, the mid-point of the series diodes 220 and series resistors 230 being tied together. The three-phase diode bridge 205 outputs to a single RC output filter 270, including filter resistor 275 and filter capacitor 280. Bleed resistor 290 is connected in parallel to filter capacitor 280.

The three-phase diode bridge 205 automatically switches the single RC filter 270 to the AC line being commutated in the thyristor bridge (not shown). Single RC filter 270 protects the thyristor being commutated by absorbing the overvoltage peaks and limiting dv/dt on the thyristor. Utilization of series diodes 220 provides some voltage margin and some degree of redundancy in providing a path to the overvoltage protection afforded by single RC filter 270. Series resistors 230 force voltage sharing across series diodes 220. Bleed resistor 290 dissipates thyristor recovery energy absorbed by filter capacitor 280 of single RC output filter 270.

Evaluation of the bucket suppressor approach, used in some designs especially in Europe, revealed several disadvantages. This approach removes all snubbers and relies on a single capacitor to absorb recovery energy from all thyristors. This results in high stress in the capacitor. The diode bridge also sees high peak currents. Sizing the diode bridge to handle the high voltages and current peaks can make this an expensive approach. In addition, the diodes also have recovery charges, which result in additional transient disturbances to the system. Reliability is lower due to the higher failure rates of active diodes compared to passive designs.

Accordingly, there is a need to provide an exciter circuit that delivers reliability and adequate margin to limits for components, but which also reduces complexity, components and cost.

BRIEF DESCRIPTION OF THE INVENTION

The present invention relates to an apparatus and method for providing protection to components of a thyristor power converter for excitation applications.

Briefly in accordance with one aspect of the present invention, a three-phase AC line filter is provided for a three-phase thyristor bridge in excitation applications. The three-phase AC line filter includes input line connection terminals for connection to a three-phase AC power source; circuits incorporating a series resistive element and a series capacitive element, where the resistive and capacitive elements are connected across the input line connection terminals; and bleed resistors are connected to each of the input line connection terminals.

In accordance with a second aspect of the present invention, an exciter system for the field of a synchronous generator excitation is provided. The exciter system includes an AC power source; a three-phase bridge having six legs, the three-phase bridge being connectable with the AC power source, and being adapted to provide a variable DC voltage output; a thyristor in each of the six legs of the three-phase bridge, wherein the thyristors provide a path for a device current; and a three-phase AC line filter, including series resistive and capacitive elements across each phase of the AC power source; and a plurality of bleed resistors, wherein at least one bleed resistor is connected to each AC input connection of the filter.

According to a further aspect of the present invention, a method is provided for converting an AC voltage to a DC voltage using a three-phase bridge thyristor bridge to supply the field of a synchronous electrical generator. The method includes providing an AC power supply; triggering the thyristors when the AC power supply provides a positive voltage; controlling the firing of the thyristors to establish the level of a DC output; supplying a three-phase AC line filter; and using the line filter for protection on AC input transients, thyristor switching transients, and bleeding charge off the three-phase AC line filter when the AC input is deenergized.

BRIEF DESCRIPTION OF THE DRAWING

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

The following embodiments of the present invention have many advantages, including reduced complexity, fewer components and lower cost. At the same time, reliability is improved.

One aspect of the present invention provides a three-phase input AC filter circuit, which provides protection for the components of the three-phase thyristor bridge circuit with a reduced amount of bridge filtering components compared to conventional practice. In particular, RC snubbers in parallel with the thyristors and ferrite inductors in series with the thyristors have been eliminated. This configuration instead relies on a three-phase AC line filter to absorb thyristor recovery energy and to protect the thyristors and other system components from excessive voltage and current gradients and voltage levels.

Some prior art applications, which were originally designed as power converters for drive applications, have been directly reused for excitation applications, without consideration of the potentially reduced filtering requirements that might be present in excitation applications. Alternately, excitation converters designs may have been excessively influenced by drive converter designs. Other designs have already removed all the filtering components typically supplied in more conservative designs, and have replaced them with a single filter often referred to as bucket filter or bucket suppressor. This bucket filter approach uses a single RC filter connected to the AC line via a 3-phase diode rectifier bridge.

These considerations led to the idea of using a three-phase AC line filter instead of a bucket filter as the sole method of bridge filtering. The three-phase filter requires no active diodes, and distributes the energy to 3 capacitors instead of one, resulting in lower stresses, higher reliability, and lower cost. The filter can be sized to limit overshoots on the AC line to any specified value while also observing the thyristor level and rate specifications.

Using only a three-phase AC line filter without also including snubbers and ferrites offers a component cost advantage since fewer components are required. It also offers a labor cost advantage since the filter can be assembled as a separate module. Assembly of the bridge is also simplified since there are fewer parts and less wiring. This can also reduce the size of the bridge and reduce the cooling requirements of the bridge or permit increased rating. While a bucket filter offers some of these advantages, the bucket filter is less reliable and a more expensive solution since it involves active components such as diode rectifiers. These diodes also introduce additional stresses due to reverse recovery transient currents.

Figure 3:
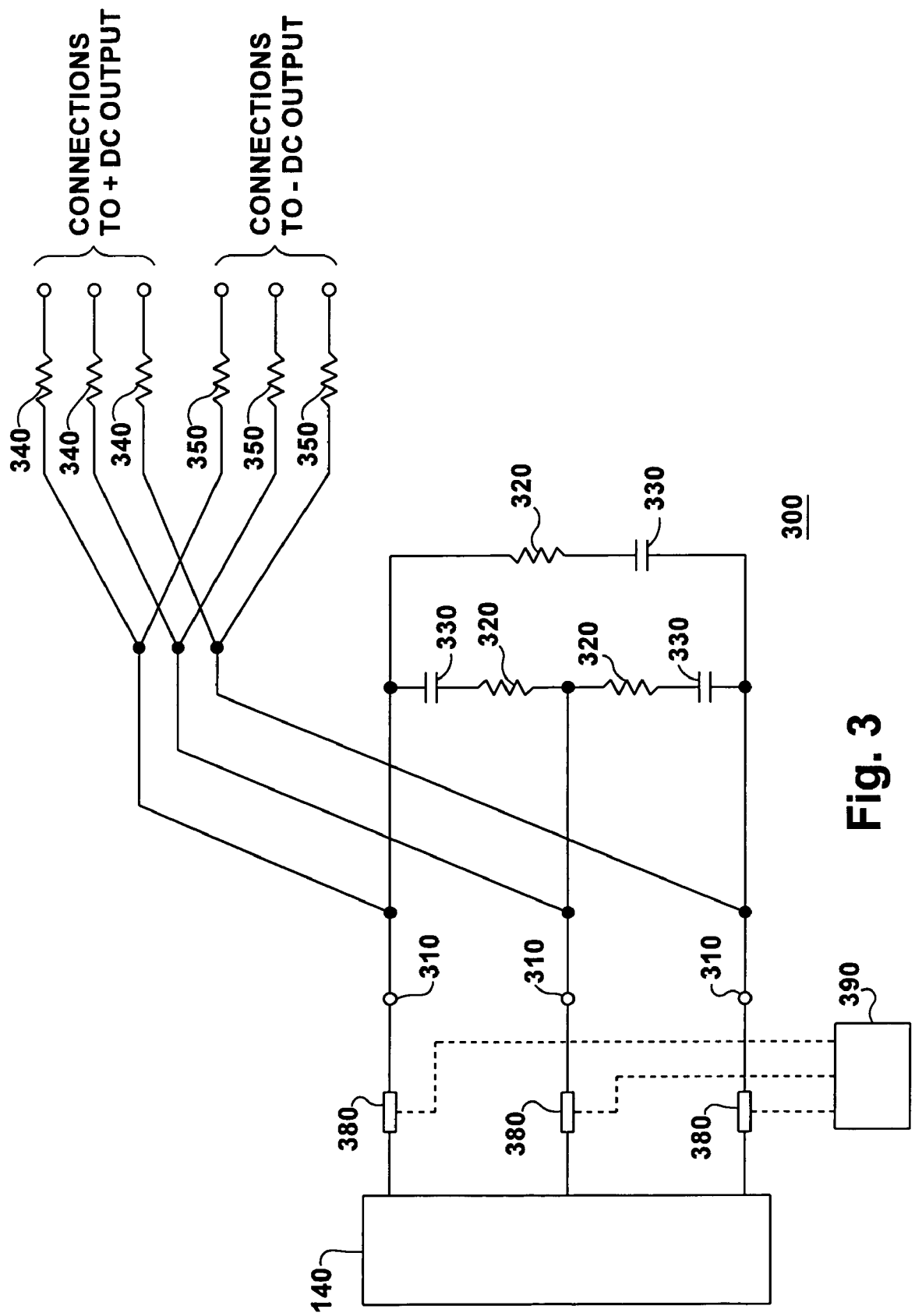
FIG. 3 illustrates a three-phase AC line filter for protection of a three-phase thyristor bridge in excitation applications according to a first aspect of the present invention.

FIG. 3 illustrates a three-phase AC line filter for protection of a 3-phase thyristor bridge in excitation applications according to a first aspect of the present invention. As with a conventional three-phase AC line filter, connections are provided across the input AC phases to provide protection for AC line transients from the AC source and from transients imposed by thyristor switching. The three-phase AC line filter 300 includes a series resistive element 320 and a series capacitive element 330 (collectively called RC elements) arranged in a delta configuration for connection across each AC input phase at input line connection points 310. Alternatively, equivalent resistive and capacitive elements of the three-phase AC line filter may be connected in a wye configuration across AC input phase connection points 310, according to a delta-wye equivalence, well-known in the field.

Each of three delta input line connection points 310 also provides for connecting the filter to a plurality of bleed resistors. Each of these 3 input line connection points 310 is connected to two bleed resistors (340 and 350). All six bleeder resistors (340 and 350) may be of equal resistance. When installed in a thyristor bridge (not shown), the bleed resistor 340 from each connection point 310 is provided to connect to a positive DC output of the bridge and the bleed resistor 350 is provided to connect to a negative DC output of the bridge.

Figure 1:
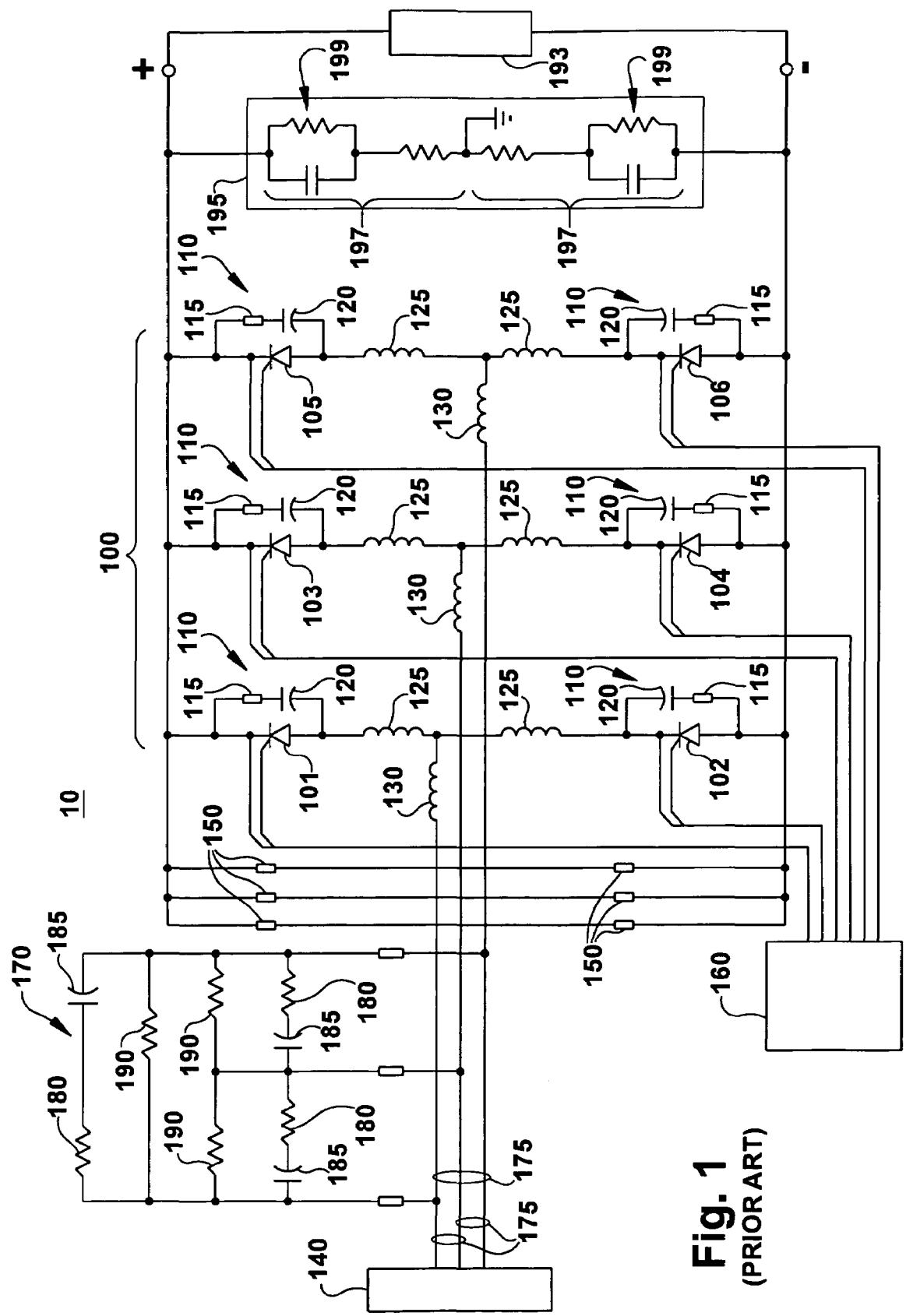
FIG. 1 illustrates a three-phase thyristor bridge AC to DC exciter including conventional transient protection.
Figure 2:
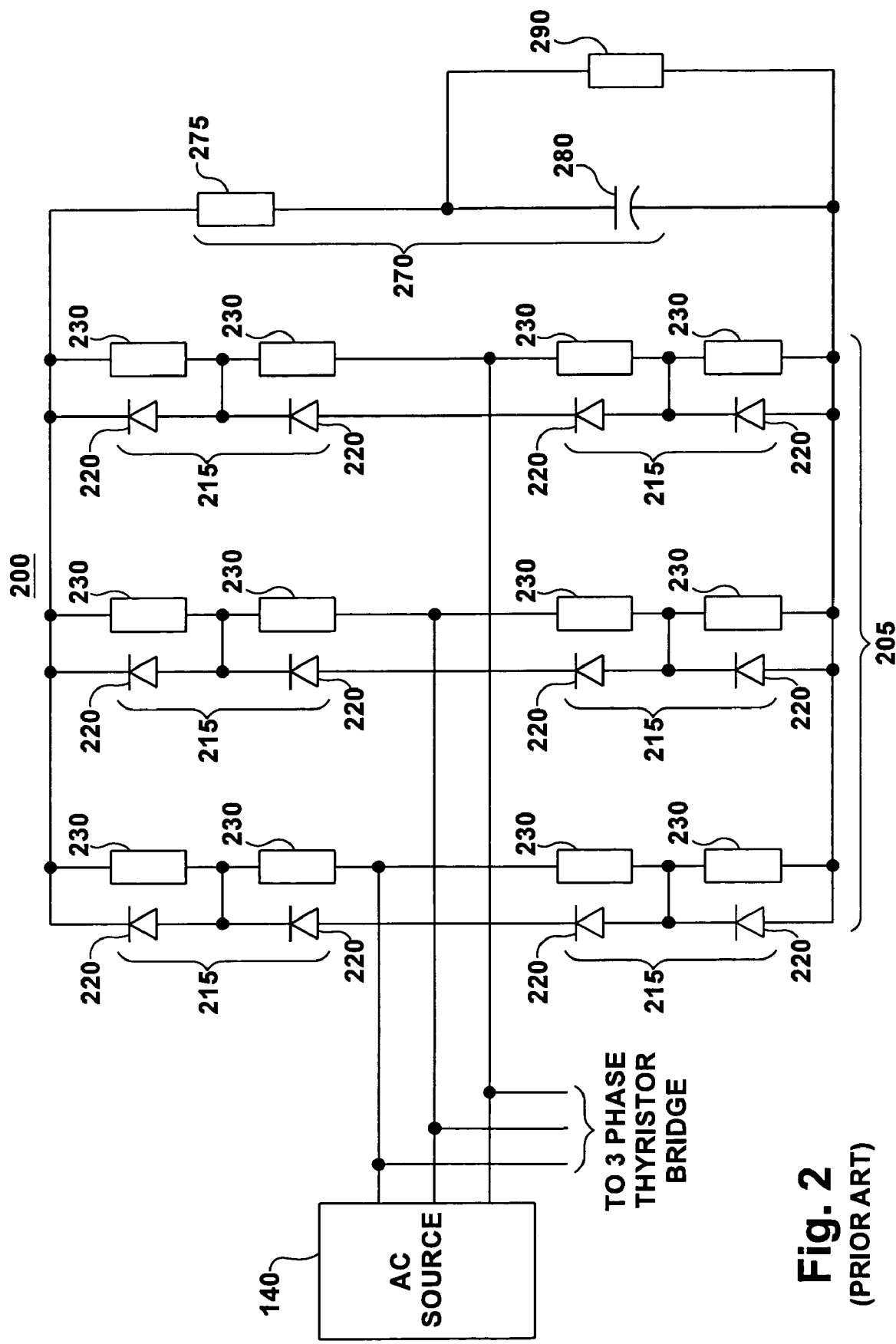
FIG. 2 illustrates a bucket filter circuit for transient protection.

When the AC power source is isolated for maintenance purposes, the bleed resistors serve the function of allowing charge on the capacitive elements 330 of the three-phase AC line filter to bleed off through bleed resistors 340 tied together at the positive DC output of the thyristor bridge (not shown) and through bleed resistors 350 of the negative DC output lines of the thyristor bridge (not shown). Dissipation of the charge on the capacitive elements is necessary for personnel and equipment safety in addition to isolating the input power. Use of the bleed resistors in this manner, eliminates the need for separate discharge resistors 190, as shown in FIG. 1. The bleed resistors further provide peak reverse voltage protection for SCRs 411-416 when connected with a thyristor bridge 410, as shown in FIG. 4 and later discussed.

A blown fuse indicator 390 may be provided to detect blowing of line fuses 380, thereby indicating possible impairment of protection provided by the three-phase AC line filter.

A second aspect of the present invention provides an exciter, which may be applied for a synchronous generator, incorporating a simplified, and more reliable component protection for the exciter through the inventive three-phase AC line filter protection.

Figure 4:
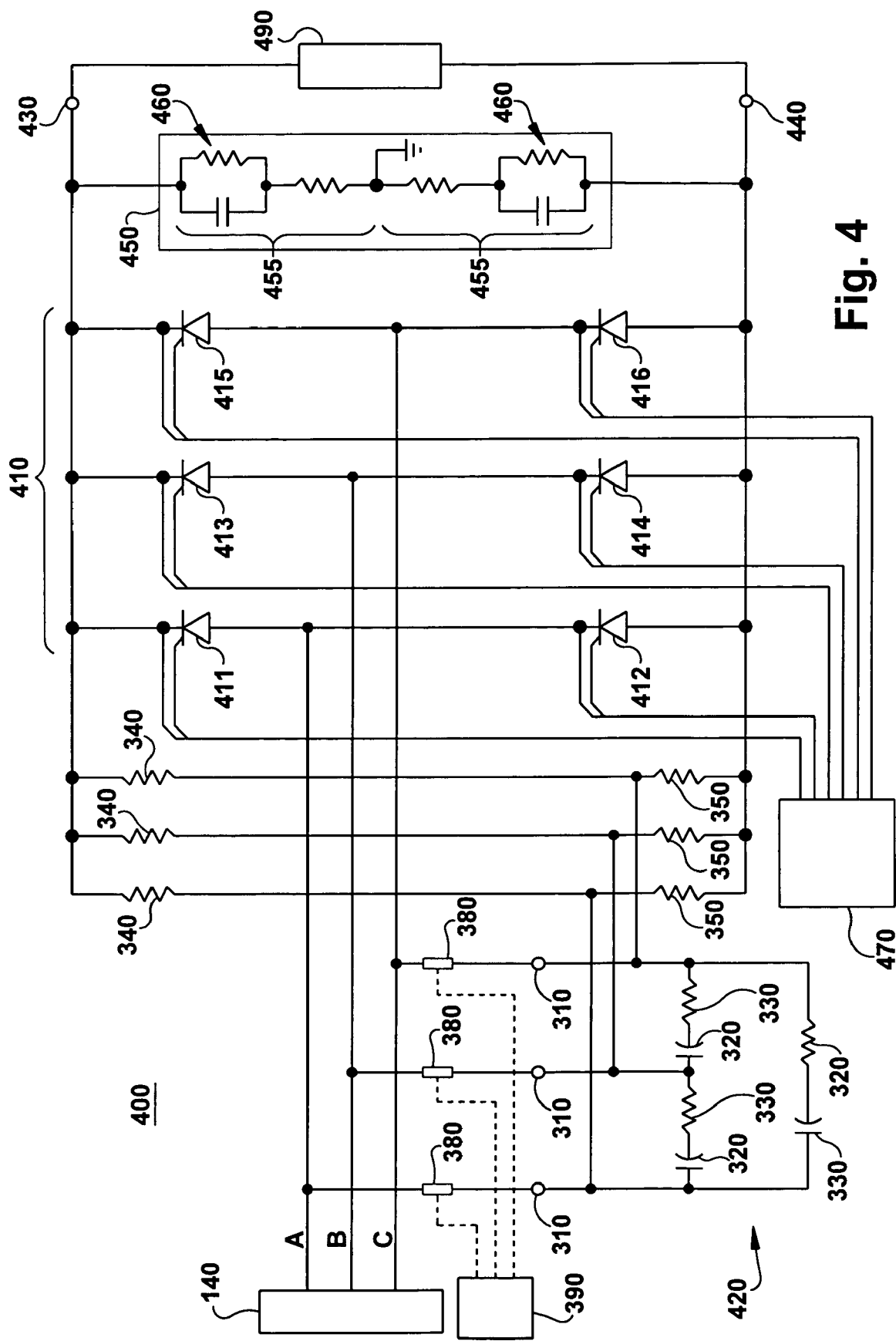
FIG. 4 illustrates an exciter for a synchronous generator that incorporates simplified and more reliable component protection for the exciter using a three-phase AC line filter.

FIG. 4 illustrates the exciter 400, which may include an AC power source 140, a three-phase thyristor bridge 410, a three-phase AC line filter 420, and an output shaft voltage suppressor (SVS) filter 450. Three-phase thyristor bridge 410 includes thyristors 411-416 and provides controlled DC voltage output at positive DC output terminal 430 and negative DC output terminal 440. Gating controls 470 may trigger the turn-on of the individual thyristors 411-416 when the AC power source 140 forward biases the thyristor.

AC power source 140 is rated for sufficient voltage and power to provide the DC power requirements for the field windings 490 of the specific electric generator being excited. Not shown is a three-phase AC breaker and/or DC contractor/breaker provided for an actual exciter implementation.

In operation, assuming that the AC power supply 140 provides a voltage $V_S=E^*\sin(wt)$, then $V_S$ is positive when $0<wt<\pi$ and $V_S$ is negative when $\pi<wt<2\pi$. A thyristor can only be triggered when the AC voltage across it is positive. For the A phase positive thyristor 411 this only occurs when $V_{AC}$ is positive, where $V_{AC}$ is the voltage of phase A with respect to phase C, thus there is 180 degree interval over which the A phase positive thyristor can be triggered. Similar relationships occur for the other thyristors 412-416 with phase control requiring firing angles that vary over a 180 degree interval. When any of thyristors 1-6 is triggered at $wt=\alpha$, then $\alpha$ is called the firing angle.

The thyristors 411-416 may be forward biased but remain in a blocking state until triggered by firing circuits (470). When triggered, the thyristors 411-416 start conducting and remain conducting until after the voltage $V_{AC}$ reverses polarity and the current in the inductance of the power source associated with the power supply 140 is forced to substantially zero.

A plurality of bleed resistors 340 of the three-phase AC line filter 420 are connected between the input AC lines 310 on the load side of fuses 380 to the positive DC output 430 of the thyristor bridge 410. A plurality of bleed resistors 350 of the three-phase AC line filter 420 are connected between the input AC lines 310 on the load side of fuses 380 to the negative DC output 440 of the thyristor bridge 410.

Bleed resistors 340 and 350 serve two purposes. First, when power supply 140 is turned off, these provide a bleed path to bleed off all energy stored in capacitors 330. Second, when both thyristors across the same phase of the bridge (for example 411 and 412) are in the off state, the reverse voltage across the pair may not be equally distributed. Bleed resistors 340 and 350 create voltage dividers to evenly divide the reverse voltage and prevent exceeding voltage limits across the devices.

SVS filter 450, of FIG. 4, limits dv/dt on the DC output. Its primary purpose is to reduce voltage induced on the shaft and bearings of the rotating electrical equipment being excited (not shown). However, the SVS may also assist in limiting affects dv/dt on the thyristor bridge. The SVS filter may include a series combination of one or more voltage transient suppressor circuits 455. Each voltage transient suppressor circuit may include a plurality of RC suppressor elements 460. A center tap on the SVS filter 450 is tied to ground.

A further aspect of the present invention provides a method for converting an AC voltage to a DC voltage using a three-phase bridge thyristor bridge to supply the field of an electrical machine, such as a synchronous electrical generator. The method may include providing an AC power supply; triggering thyristors when the AC power supply provides a positive voltage; controlling the firing of the thyristors to establish the level of a DC output; supplying a three-phase AC line filter; and using the line filter for protection on AC input transients and thyristor switching transients.

The step of supplying a three-phase AC line filter includes providing a series resistive and capacitive (RC) filter element across each phase of the input line. The RC filter element across each phase of the input line absorbs input transients. The step does not include supplying a discharge resistor 190 (FIG. 1) normally supplied across the RC filter element in each line phase in a conventional line filter application 170 (FIG. 1). The method also includes supplying a plurality of bleed resistors (340 and 350) for each phase of the input AC, a first bleed resistor for connecting the input AC phase to a positive DC output 430 of the thyristor bridge 410 and a second resistor for connecting the input AC phase to a negative DC output 440 of the thyristor bridge 410 (as shown in FIG. 4).

A step of using the three-phase AC line filter for protection from the AC input transients and thyristor switching transients further includes filtering transients appearing directly across the AC input line with the RC filter elements in each line phase.

When the three-phase AC line filter absorbs a transient, either from input line or from the DC output, charge is built up on the capacitive element. The step of using the line filter for protection on AC input transients and thyristor switching transients further comprises bleeding off the built-up, built-up on the capacitive element of the RC filter element after the AC power supply 140 is deenergized. For example for capacitor 330 connected across one input phase, a bleed path is formed from the input phase through one bleed resistor 340 to the positive DC bus output 430 of the thyristor bridge 410, returning through another bleed resistor 340 to the input phase at the other end of the same capacitor 330. Similar bleed paths exist through bleed resistors 350 to the negative DC bus output 440 of the thyristor bridge 410.

When thyristors (411 and 412 for example) in adjacent legs tied to a common AC phase (phase A for example) of the three-phase thyristor bridge 410 are in the off-state, the voltage across the DC output bus (430 to 440) may not be evenly distributed across both thyristors, resulting in overvoltage on one thyristor. The method further comprises preventing excessive voltage across thyristors in these common input legs of the thyristor bridge 410, when both thyristors in the common input legs of the three-phase thyristor bridge 410 are in an off-state, by balancing voltage across the thyristors with the bleed resistor 340 and the bleed resistor 350 dividing voltage across the DC output between the two thyristors.

Embodiments of the inventive filter and exciter (600 VAC-1300 VAC, 530-3300 ADC applications) have been tested in the laboratory. The embodiment of the exciter has also been modeled in a computer simulation package. Good agreement between the model and the actual lab unit has been obtained under numerous configurations.

Figure 5:
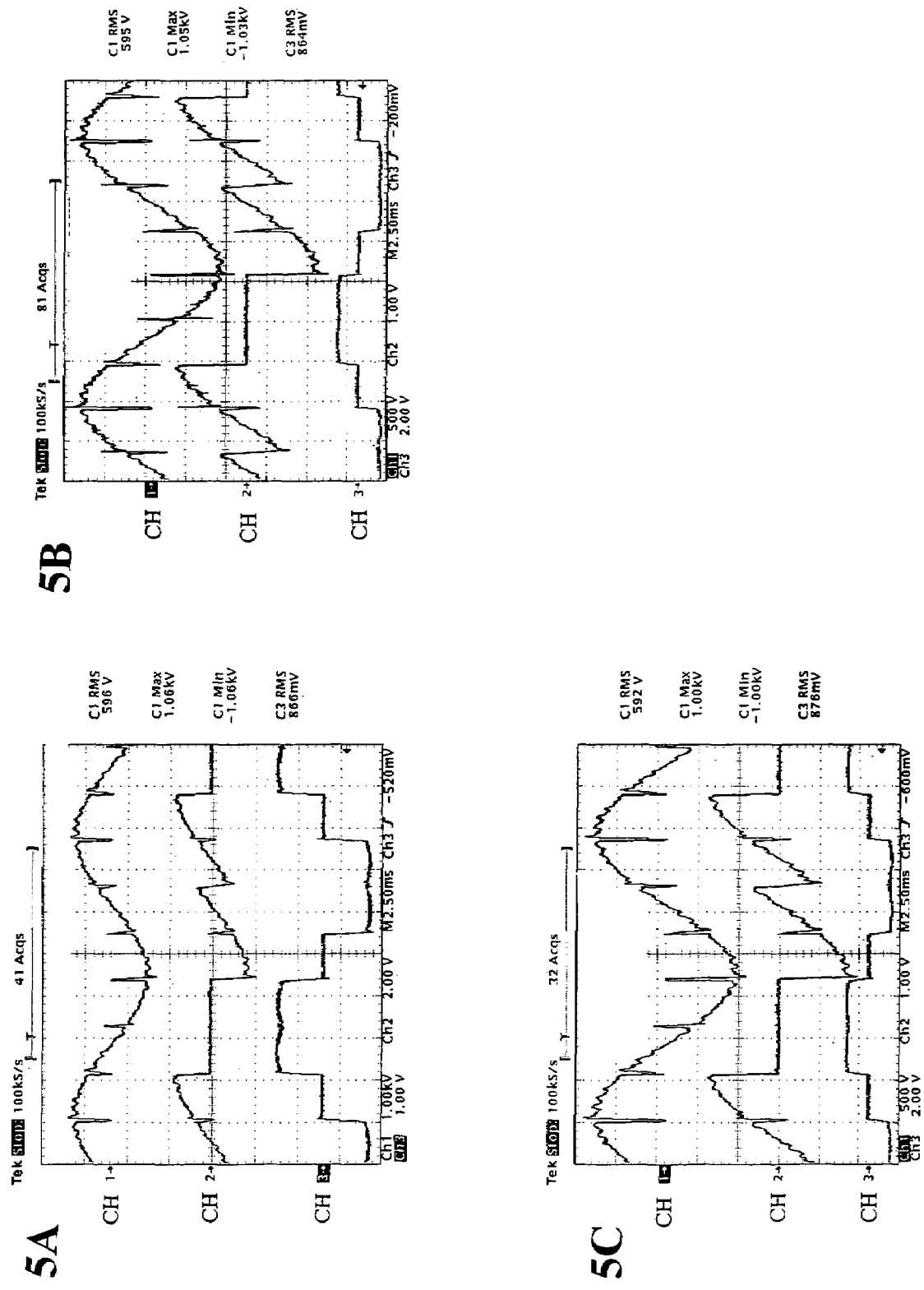
FIG. 5 illustrates comparative performance for an exciter with a conventional line filter, a bucket filter and an inventive three-phase AC line filter for line voltage, voltage across a thyristor, and line current, during thyristor switching

FIG. 5 provides measured test results in an exciter application for comparison of a conventional AC line filter; a bucket filter; and an embodiment of the inventive filter without snubbers across the thyristors and without ferrites in place. Testing is performed with the filters applied to a 42 mm, 600 VAC, 530 ADC thyristor bridge.

FIG. 5 illustrates line voltage, voltage across a thyristor, and line current, during switching operations, as CH 1, CH 2 and CH 3 respectively. In the embodiment of the inventive filter and exciter, without the snubbers and ferrites and without discharge resistor on the three-phase input AC filter (5C), line voltage, thyristor voltage and rate of change of thyristor current are comparable to performance with the snubbers and ferrites in place (5A). Operation with the bucket filter (5B) results in higher voltage spikes across the thyristor, as displayed on CH 2.

The comparable switching performance with the inventive filter is provided with fewer elements than the conventional three-phase AC line filter, reducing complexity and cost. Snubbers, line ferrites and leg ferrites are not required. The separate element of the discharge resistor is also eliminated in the inventive three-phase AC line filter. Smaller voltage transients across the thyristors are delivered with by the inventive filter circuit compared with the bucket filter circuit, with less complexity, lower cost, and without active elements (diodes). Less complexity by the inventive filter circuit, compared with the conventional three-phase AC line filtering and the bucket filter circuit, also result in more reliability of the inventive filter.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A three-phase AC line filter for a three-phase thyristor bridge for excitation applications, the three-phase AC line filter comprising:
   input line connection terminals for connection to a three-phase AC power source;
   a plurality of circuits including a series resistive element and a series capacitive element, the elements being connected across the input line connection terminals; and
   a plurality of bleed resistors connected to each of the input line connection terminals.

2. The three-phase input AC line filter of claim 1, wherein the plurality of bleed resistors connected to each of the input line connection terminals comprises:
   a bleed path for connecting the input line connection terminal to a positive DC output of a three-phase thyristor bridge to be protected; and
   a bleed path for connecting the input line connection terminal to a negative DC output of the three-phase thyristor bridge to be protected.

3. The three-phase AC line filter of claim 2, further comprising: overcurrent protection in each AC input line to the filter.

4. The three-phase AC line filter of claim 3, wherein the overcurrent protection for the filter further comprises: a fuse in each AC input line to the filter.

5. The three phase AC line filter of claim 4, wherein the plurality of bleeder resistors connected to each input line connection terminal comprises: a connection on the line side of the fuse in each AC input line to the filter.

6. An exciter system for the field of a synchronous generator excitation, the exciter system comprising:
   an AC power source;
   a three-phase bridge having six legs, the three-phase bridge being connectable with the AC power source, and being adapted to provide a variable DC voltage output;
   a thyristor in each of the six legs of the three-phase bridge, wherein the thyristors provide a path for a device current; and
   a three-phase AC line filter series, including series resistive and capacitive elements in delta configuration across each phase of the AC power source and a plurality of bleed resistors, wherein at least one bleed resistor is connected to each AC input connection of the filter.

7. The exciter system of claim 6, wherein the plurality of bleed resistors comprise: two bleed resistors connected at each AC input connection terminal to the three-phase AC line filter.

8. The exciter system of claim 7, wherein two bleed resistors connected at each AC input connection terminal to the three-phase AC line filter further comprise: resistor elements of approximately equal resistance.

9. The exciter system of claim 8, wherein the two bleed resistors connected to each of the AC input connection terminals further comprise:
   bleed resistors connected between each AC input connection terminal of the AC line filter and a positive DC output bus of the three-phase thyristor bridge; and
   bleed resistors connected between each AC input connection terminal of the AC line filter and a negative output bus of the three-phase thyristor bridge.

10. The exciter system of claim 9, further comprising an output shaft voltage suppressor connected between the positive DC output bus and the negative DC output bus of the three-phase thyristor bridge.

11. A method for converting an AC voltage to a DC voltage using a three-phase bridge thyristor bridge to supply the field of a synchronous electrical generator, the method comprising:
   providing an AC power supply;
   triggering the thyristors when the AC power supply provides a positive voltage;
   controlling the firing of the thyristors to establish the level of a DC output;
   supplying a three-phase AC line filter; and
   using the line filter for protection on AC input transients and thyristor switching transients.

12. The method for converting an AC voltage to a DC voltage using a three-phase thyristor bridge as claimed in claim 11, wherein the step of supplying a three phase AC line filter further comprises:
   providing a series resistive and capacitive (RC) filter element across each phase of the AC line input; and supplying a plurality of bleed resistors for each phase of the input AC, including bleed resistors for connecting the input AC phase to a positive DC output of the thyristor bridge and bleed resistors for connecting the input AC phase to a negative DC output of the thyristor bridge.

13. The method for converting an AC voltage to a DC voltage using a three-phase thyristor bridge as claimed in claim 12, wherein the step of supplying a plurality of bleed resistors further comprises: providing bleed resistors of an equal resistance value.

14. The method for converting an AC voltage to a DC voltage using a three-phase thyristor bridge as claimed in claim 13, wherein the step of using the three-phase AC line filter for protection on AC input transients and thyristor switching transients further comprises:

filtering transients appearing directly across the AC input line; and filtering the thyristor switching transients.

15. The method for converting an AC voltage to a DC voltage using a three-phase thyristor bridge as claimed in claim 14, wherein the step of using the three-phase AC line filter for protection on AC input transients and thyristor switching transients further comprises:

when the AC input power is isolated, bleeding a charge built-up on the capacitive element of the RC filter element across each phase of the AC input, through the bleed resistors.

16. The method for converting an AC voltage to a DC voltage using a three-phase thyristor bridge as claimed in claim 15, wherein the step of using the three-phase AC line filter for protection on AC input transients and thyristor switching transients, further comprises:

preventing excessive voltage across thyristors, when the thyristors in legs of the three-phase bridge with a common AC input line are in an off-state, by balancing voltage across the thyristors with the bleed resistor connected to the common AC input line and the positive DC output of the thyristor bridge, and with the bleed resistor connected to the common AC input line and the negative DC output of the thyristor bridge, thereby dividing voltage across the DC output between the two thyristors.

* * * * *